(12) United States Patent
Ohuchi et al.

(10) Patent No.: US 6,259,163 B1
(45) Date of Patent: *Jul. 10, 2001

(54) BOND PAD FOR STRESS RELEIF BETWEEN A SUBSTRATE AND AN EXTERNAL SUBSTRATE

(75) Inventors: Shinji Ohuchi; Yoshimi Egawa; Noritaka Anzai, all of Tokyo (JP)

(73) Assignee: Oki Electric Industry Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/167,529

(22) Filed: Oct. 7, 1998

(30) Foreign Application Priority Data

Dec. 25, 1997 (JP) .................................... 9-367155

(51) Int. Cl.$^7$ .................................................. H01L 23/48
(52) U.S. Cl. .......................... 257/779; 257/738; 257/778; 257/786; 361/760; 361/773; 361/774
(58) Field of Search ..................... 257/737, 738, 257/773, 775, 778, 779, 780, 777, 781, 786; 438/108, 612, 613, 614, FOR 343, 615; 361/764, 772, 773, 774, 777, 760

(56) References Cited

U.S. PATENT DOCUMENTS

| 5,386,624 | * | 2/1995 | George et al. | 29/832 |
|---|---|---|---|---|
| 5,633,204 | * | 5/1997 | Tago et al. | 438/614 |
| 5,740,956 | * | 4/1998 | Seo et al. | 228/180.22 |
| 5,866,942 | * | 2/1999 | Suzuki et al. | 257/698 |
| 5,889,655 | * | 3/1999 | Barrow | 361/760 |
| 5,940,679 | * | 8/1999 | Tomura et al. | 438/15 |
| 6,075,290 | * | 6/2000 | Schaefer et al. | 257/737 |

FOREIGN PATENT DOCUMENTS

| 4-63434 | * | 2/1992 | (JP) . |
| 10-209326 | * | 8/1998 | (JP) . |

* cited by examiner

Primary Examiner—Olik Chaudhuri
Assistant Examiner—Alonzo Chambliss
(74) Attorney, Agent, or Firm—Jones Volentine, L.L.C.

(57) ABSTRACT

A metal pattern 4 is formed at a rear surface of a substrate 3 at a front surface of which a molded semiconductor chip is mounted, the metal pattern 4 is covered with an insulating film 5 except at its connecting area 4a and a solder ball 6 is bonded to the connecting area 4a. The area of the metal pattern 4 other than the connecting area 4a inclines toward the substrate 3 and gradually becomes thinner toward the outside. Stress, which is applied to the solder ball 6, is imparted in a diagonal direction and is dispersed. As a result, the number of occurrences of cracks X is reduced and the solder ball which is used to achieve connection with an external substrate is effectively prevented from becoming electrically disconnected.

9 Claims, 13 Drawing Sheets

BOND PAD FOR STRESS RELEIF BETWEEN A SUBSTRATE AND AN EXTERNAL SUBSTRATE

BACKGROUND OF THE INVENTION

The present invention relates to a semiconductor device and a manufacturing method thereof. With the rapid advent of portable devices such as mobile phones and IC cards in recent years, and the resulting need for thinner, lighter, more compact resin-sealed semiconductor devices to be mounted in those devices, a great number of means to fulfill such need have been proposed in the prior art. In one such instance, a method for mounting a resin-sealed semiconductor device 101 at an external substrate 102 such as a printed circuit board, as illustrated in FIG. 31, is proposed.

In the resin-sealed semiconductor device 101 that achieves this mounting state, a mold portion 104 constituted by sealing a semiconductor chip is provided at a front surface of a substrate 103 constituted of an epoxy resin, ceramic or the like and solder balls 105 to function as solder bumps are bonded in advance at specific connecting areas at a rear surface of the substrate 103. Then, the semiconductor device 101 in this state is placed on the external substrate 102 and the entire assembly is placed in an atmosphere at a temperature ranging approximately from 220 centigrade to 240 centigrade. Thus, the solder balls 105 are at least partially melted so that the semiconductor device 101 can be mounted at the external substrate 102. Through this mounting method, electrical characteristics with a low capacity and low inductance are achieved.

To describe the structure of the resin-sealed semiconductor device 101 that achieves this mounting state in more detail, in reference to FIG. 32, a metal pattern 106 formed at a rear surface of the substrate 103 is covered with an insulating film 107 constituted of, for instance, a solder resist, except at a specific connecting area 106a, the connecting area 106a is set so that it lies flush with a front surface of the insulating film 107 and a surface of the connecting area 106a is flat. A solder ball 105 is bonded to the connecting area 106a.

When mounting the semiconductor device 101 at the external substrate 102, the solder ball 105 is aligned at a specific electrode portion 109 formed between insulating layers 108 and 108 and then the entire assembly is placed in a specific heated atmosphere in this state.

However, the following problem manifests with the semiconductor device 101 in the prior art structured as described above in a reliability test which is performed after it is mounted at the external substrate 102. Namely, during the reliability test in which the semiconductor device is exposed to an atmosphere at room temperature or within the range of -65 centigrade to 150 centigrade, an electrical disconnection sometimes occurs at the solder balls 105. This is considered to be caused by the difference between the coefficients of thermal expansion of the semiconductor device 101 constituted of the substrate 103 and the mold portion 104 and of the external substrate 102 at which the semiconductor device 101 is mounted, which causes the semiconductor device 101 to be stretched and to contract, as illustrated in FIG. 33, causing cracks 110 and 111 to be formed at a solder ball 105, which, in turn, leads to degradation of the electrical characteristics and eventually to disconnection as these cracks 110 and 111 grow to link with each other.

In an examination of the positions at which the cracks 110 and 111 are formed, their patterns and their directions, conducted by the inventor of the present invention, cracks were found to form near the metal pattern 106 to extend in parallel to the metal pattern 106 in most instances. The inventor of the present invention conducted a similar experiment after essentially modifying the shape of the metal pattern connecting area which is bonded with the solder ball, and a great improvement was observed.

SUMMARY OF THE INVENTION

A first object of the present invention, which has been completed by addressing the problem of the semiconductor devices and the manufacturing method thereof in the prior art, is to provide a new and improved semiconductor device with which it is possible to reduce the number of cracks that are formed compared to the prior art and even when they are formed, they are formed and extend in a direction in which disconnection does not readily occur.

A second object of the present invention is to provide a method for manufacturing such a semiconductor device.

In order to achieve the first object of the present invention, in a first aspect of the present invention, a semiconductor device provided with a substrate having a semiconductor chip at a front surface thereof and a conductor pattern formed at a rear surface of the substrate, i.e., at the mounting surface, with the conductor pattern covered with an insulating film except at specific connecting areas and solder bumps bonded to the connecting areas, which is characterized in that the area of the conductor pattern outside the connecting areas covered by the insulating film inclines toward the substrate, is provided.

An examination conducted by the inventor of the present invention verified that with the area of the conductor pattern such as a metal pattern covered with the insulating film outside the connecting areas made to incline toward the substrate, the rate of cracking is reduced and that even when a crack is formed, it extends almost along the inclination, i.e., in a diagonal direction. These results are assumed to be attributable to the stress at the solder bumps such as solder balls occurring in a diagonal direction and being dispersed, caused by the difference between the coefficients of thermal expansion described earlier. Thus, with the rate of cracking reduced, degradation in the electrical characteristics can be prevented, and furthermore, even when a crack occurs, it extends in a diagonal direction and, consequently, disconnections are greatly reduced too.

In the semiconductor device achieving the advantages described above, the area of the conductor pattern covered by the insulating film outside the connecting areas can be formed so that it becomes gradually thinner, as well as inclining toward the substrate. Furthermore, the portions of the rear surface of the substrate that correspond to the connecting areas may be distended toward the solder bumps with the that conforms to the distended shape.

In addition, in order to achieve the object described above, in a second aspect of the present invention, a semiconductor device provided with a substrate having a semiconductor chip at a front surface thereof and a conductor pattern formed at a rear surface of the substrate with the conductor pattern covered with an insulating film except at specific connecting areas and solder bumps bonded to the connecting areas, which is characterized in that a stage is provided between the connecting areas and the area covered with the insulating film at the conductor pattern with the staged portion formed to have a tapered shape.

In the semiconductor device structured as described above, too, the stress at the solder bumps occurs in a diagonal direction and the stress is dispersed. As a result, the degree of degradation in the electrical characteristics and occurrences of disconnection caused by cracks formed at the solder bumps are greatly reduced.

Furthermore, in a third aspect of the present invention, a semiconductor device provided with a substrate having a semiconductor chip at a front surface thereof and a conductor pattern formed at a rear surface of the substrate with the conductor pattern covered with an insulating film except at specific connecting areas and solder bumps bonded to the connecting areas, which is characterized in that the connecting areas project out further toward the solder bumps relative to the insulating film.

With the structure in which the connecting areas which are to be bonded with the solder bumps project out further relative to the insulating film, as described above, i.e., a structure in which the connecting areas project out toward the solder bumps to which they are to be bonded, even when a crack occurs, it does not extend along the direction in which the conductor pattern is provided and, as a result, disconnection does not occur. In addition, since the stress occurring at the solder bumps is assumed to be dispersed around the connecting areas that project out, the rate of occurrence of cracks is reduced.

It is to be noted that while the connecting areas project out in the semiconductor device in the third aspect of the present invention, projecting portions may be separately bonded to the connecting areas so that those projecting portions are bonded with the solder bumps. In other words, in a fourth aspect of the present invention, a semiconductor device provided with a substrate having a semiconductor chip at a front surface thereof and a conductor pattern formed at a rear surface of the substrate with the conductor pattern covered with an insulating film except at specific connecting areas and solder bumps electrically connected to the connecting areas, which is characterized in that portions constituted of a conductor, which project out further toward the solder bumps relative to the insulating film, are bonded to the connecting areas with the solder bumps bonded to these projecting portions, is provided. It is to be noted that advantages similar to those achieved in the third aspect of the present invention are achieved through the structure in which the projecting portions are separate from the connecting areas.

In such a case, the projecting portions may be constituted through metal plating or they may be constituted of metal bumps. Metal plating will achieve a high degree of efficiency since the projecting portions can be formed through a continuous manufacturing process while plating Ni (nickel) or Au (gold) on a front surface of the base material of the conductor pattern which is constituted of copper. When constituting the projecting portions with metal bumps, on the other hand, metal bumps that are used when connecting inner leads with a thin metal wire in a resin-sealed semiconductor device, for instance, may be utilized as is, or if the metal bumps are formed as an integrated part of the thin metal wire, the metal bumps with the thin metal wires cut off can be utilized to constitute the metal bumps. Thus, the production process is facilitated and a reduction in production costs is achieved.

Furthermore, the external shape of the projecting portions in the structure described above, i.e., the external shape of the portions projecting out further toward the solder bumps relative to the insulating film may be a shape with a convex curve toward the projecting side, i.e., toward the solder bump, a truncated cone shape (trapezoidal cross section) or a conical shape (triangular cross section). Alternatively, it may have a simple cylindrical shape (quadrangular cross section). It is to be noted that if the planar shape of the connecting areas is quadrangular, the external shape of the projecting portions may be a frustum of a quadrangular pyramid, a quadrangular pyramid or a quadrangular prism accordingly.

Moreover, the external shape of the portions projecting further out relative to the insulating film may have a shape of a curved surface achieved by cutting a portion of a sphere across a plane, a shape achieved with the external circumferential surface of the side of a projecting portion constituting a convex curve toward the outside over the entire circumference or a shape that gradually broadens toward the substrate.

Spherical solder bumps (so-called solder balls) that have been in use in the prior art may be employed for bonding. Furthermore, at least part of the semiconductor chip to be mounted on the substrate, e.g., its inner leads and electrode pads, may be molded with a resin or another insulating material.

Moreover, to fulfill the second object of the present invention of providing a method for manufacturing a semiconductor device with which the rate of occurrence of cracking described earlier is reduced and even if a crack occurs, it does not extend along the conductor pattern to cause disconnection, a method for manufacturing a semiconductor device provided with a substrate having a semiconductor chip at a front surface thereof and a conductor pattern formed at a rear surface of the substrate with the conductor pattern covered with an insulating film except at specific connecting areas and solder bumps bonded at the connecting areas which comprises a step for forming a conductor pattern at a rear surface of the substrate, a step for providing an insulator constituted of, for instance, a ceramic plate, a resin plate or the like at the conductor pattern other than at the specific connecting areas, a subsequent step for applying pressure to the insulator toward the substrate and a subsequent step for bonding solder bumps to the connecting areas may be proposed as a fifth aspect of the present invention.

Through the method for manufacturing a semiconductor device characterized as described above, the semiconductor device structured as described above can be manufactured with ease, since pressure is applied toward the substrate to the insulator constituted of a ceramic plate, a resin plate or the like provided at the conductor pattern other than at the specific connecting areas to cause the crushed peripheral portion and the like of the conductor pattern to enter the gap formed by the thickness of the conductor pattern between the insulator and the substrate and to cause the substrate and the insulator to become deformed.

In this method, a step for thinly plating the connecting areas at a front surface of the conductor pattern which is often constituted of Cu (copper) with Ni (nickel) or Au (gold) may be implemented before the application of pressure or it may be implemented before bonding solder bumps after the application of pressure.

In addition, in a sixth aspect of the present invention, a method for manufacturing a semiconductor device provided with a substrate having a semiconductor chip at a front surface thereof and a conductor pattern formed at a rear surface of the substrate with the conductor pattern covered with an insulating film except at specific connecting areas and solder bumps bonded at the connecting areas, which comprises a step for forming a conductor pattern at a rear surface of the substrate, a step for forming the circumferential edges of the specific connecting areas at the conductor patterns in a tapered shape through an etching process, a subsequent step for forming an insulating film at the conductor pattern other than at the specific connecting areas and a subsequent step for bonding solder bumps at the connecting areas, is provided.

Through this manufacturing method, the semiconductor device in the second aspect of the present invention can be manufactured with ease, since the insulating film is formed at the conductor pattern other than at the specific connecting areas after the circumferential edges of the specific connecting areas at the conductor pattern have been formed in a tapered shape through an etching process.

Through this method, by setting the film thickness of the insulating film so that the connecting areas project further out relative to the insulating film when forming the insulating film at the area other than the specific connecting areas, a semiconductor device in the third aspect of the present invention, for instance, can be manufactured with ease.

In addition, in a seventh aspect of the present invention, a method for manufacturing a semiconductor device provided with a substrate having a semiconductor chip at a front surface thereof and a conductor pattern formed at a rear surface of the substrate with the conductor pattern covered with an insulating film except at specific connecting areas and solder bumps electrically connected to the connecting areas, which comprises a step for forming a conductor pattern at a rear surface of the substrate, a step for forming an insulating film at the conductor pattern other than at the specific connecting areas, a subsequent step for projecting the surfaces of the connecting areas further out relative to the insulating film by metal plating the surfaces and a subsequent step for bonding solder bumps at the metal-plated portions projecting further out relative to the insulating film, is provided.

Through the manufacturing method in the seventh aspect of the present invention, in which the surfaces of the connecting areas are made to project further out relative to the insulating film through metal plating after forming the insulating film at the conductor pattern other than at the specific connecting areas, the semiconductor device in the fourth aspect of the present invention, for instance, can be manufactured with ease.

Moreover, in an eighth aspect of the present invention, a method for manufacturing a semiconductor device provided with a substrate having a semiconductor chip at a front surface thereof and a conductor pattern formed at a rear surface of the substrate with the conductor pattern covered with an insulating film except at specific connecting areas and solder bumps electrically connected to the connecting areas, which comprises a step for forming a conductor pattern at a rear surface of the substrate, a step for metal plating the specific connecting areas at the conductor pattern, a subsequent step for covering the conductor pattern other than at the metal-plated portions with an insulating film while ensuring that the metal-plated portions project further out relative to the insulating film and a subsequent step for bonding solder bumps at the metal-plated portions projecting further out relative to the insulating film, is provided.

Unlike in the manufacturing method in the seventh aspect of the present invention explained earlier, in the manufacturing method in the eighth aspect of the present invention, the specific connecting areas in the conductor pattern are plated with metal, and then the conductor pattern is covered with an insulating film except at the metal-plated portions while ensuring that the metal-plated portions project further out relative to the insulating film. Through this manufacturing method, too, the semiconductor device in the fourth aspect of the present invention, for instance, can be manufactured with ease.

In addition, in a ninth aspect of the present invention, a method for manufacturing a semiconductor device provided with a substrate having a semiconductor chip at a front surface thereof and a conductor pattern formed at a rear surface of the substrate with the conductor pattern covered with an insulating film except at specific connecting areas and solder bumps electrically connected to the connecting areas, which comprises a step for forming a conductor pattern at a rear surface of the substrate, a step for forming an insulating film at the conductor pattern other than at the specific connecting areas, a subsequent step for causing the connecting areas to project further out relative to the insulating film by bonding metal bumps to the surfaces of the connecting areas and a subsequent step for bonding solder bumps to the metal bumps projecting further out relative to the insulating film, is provided.

Through the manufacturing method in the ninth aspect of the present invention, in which, after the insulating film is formed at the conductor pattern other than at the specific connecting areas, metal bumps are bonded to the surfaces of the connecting areas to cause the connecting areas to project further out relative to the insulating film, the semiconductor device in the fourth aspect of the present invention, for instance, can be manufactured with ease.

In addition, in a tenth aspect of the present invention, a method for manufacturing a semiconductor device provided with a substrate having a semiconductor chip at a front surface thereof and a conductor pattern formed at a rear surface of the substrate with the conductor pattern covered with an insulating film except at specific connecting areas and solder bumps electrically connected to the connecting areas, which comprises a step for forming a conductor pattern at a rear surface of the substrate, a step for bonding metal bumps to the specific connecting areas in the conductor pattern, a subsequent step for covering the conductor pattern with an insulating film except at the metal bumps while ensuring that the metal bumps project further out relative to the insulating film and a subsequent step for bonding solder bumps at the metal bumps projecting further out relative to the insulating film, is provided.

Unlike in the manufacturing method in the ninth aspect of the present invention described earlier, in the method for a manufacturing semiconductor device in the tenth aspect of the present invention, the metal bumps are first bonded to the specific connecting areas in the conductor pattern and then the conductor pattern is covered with the insulating film except at the metal bumps while ensuring that the metal bumps to project further out relative to the insulating film. Through this manufacturing method, too, the semiconductor device in the fourth aspect of the present invention, for instance, can be manufactured with ease.

In addition, in an eleventh aspect of the present invention, a method for manufacturing a semiconductor device provided with a substrate having a semiconductor chip at a front surface thereof and a conductor pattern formed at a rear surface of the substrate with the conductor pattern covered with an insulating film except at specific connecting areas and solder bumps electrically connected to the connecting areas, which comprises a step for forming a conductor pattern at a rear surface of the substrate, a step for forming an insulating film at the conductor pattern other than at the specific connecting areas, a subsequent step for projecting the connecting areas further out relative to the insulating film by bonding other solder bumps that are smaller than the solder bumps mentioned earlier to the surfaces of the connecting areas and a subsequent step for bonding solder bumps to the other solder bumps projecting further out relative to the insulating film, is provided.

Through the manufacturing method in the eleventh aspect of the present invention, which employs separate smaller solder bumps in addition to the original solder bumps, instead of the metal bumps employed in the manufacturing method in the eighth aspect of the present invention explained earlier, a semiconductor device having a portion with a convex curve toward the projecting side, for instance, can be manufactured with ease. Furthermore, the technology and the apparatus employed for bonding the original solder bumps may be directly utilized or adopted with modifications. It is to be noted that while the other solder bumps may be constituted of the same material as that constituting the original solder bumps, another soldering material having different material properties may be used as necessary.

In addition, in a twelfth aspect of the present invention, a method for manufacturing a semiconductor device provided with a substrate having a semiconductor chip at a front surface thereof and a conductor pattern formed at a rear surface of the substrate with the conductor pattern covered with an insulating film except at specific connecting areas and solder bumps electrically connected to the connecting areas, which comprises a step for forming a conductor pattern at a rear surface of the substrate, a step for bonding other solder bumps that are smaller than the solder bumps mentioned earlier at the specific connecting areas in the conductor pattern, a subsequent step for covering the conductor pattern with an insulating film except at the other solder bumps to project the other solder bumps further out relative to the insulating film and a subsequent step for bonding solder bumps mentioned earlier to the other solder bumps projecting further out relative to the insulating film, is provided.

Through the manufacturing method in the twelfth aspect of the present invention, too, in which the order in which the step for forming the insulating film and the step for bonding the other solder bumps are implemented, is reversed from that in the manufacturing method in the eleventh aspect of the present invention explained earlier, a semiconductor device having a portion with a convex curve toward the projecting side, for instance, can be manufactured with ease. It goes without saying that in this manufacturing method, too, the technology and the apparatus employed for bonding the original solder bumps can be directly utilized or adopted with modifications. In addition, the other solder bumps may be constituted of the same material as that constituting the original solder bumps, or they may be constituted of another soldering material having different material properties as necessary.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

The following is an explanation of the preferred embodiments of the present invention. It is to be noted that the same reference numbers are assigned to components having roughly the same functions and structural features in the following explanation and the attached drawings to preclude the necessity for a repeated explanation thereof.

Figure 1:
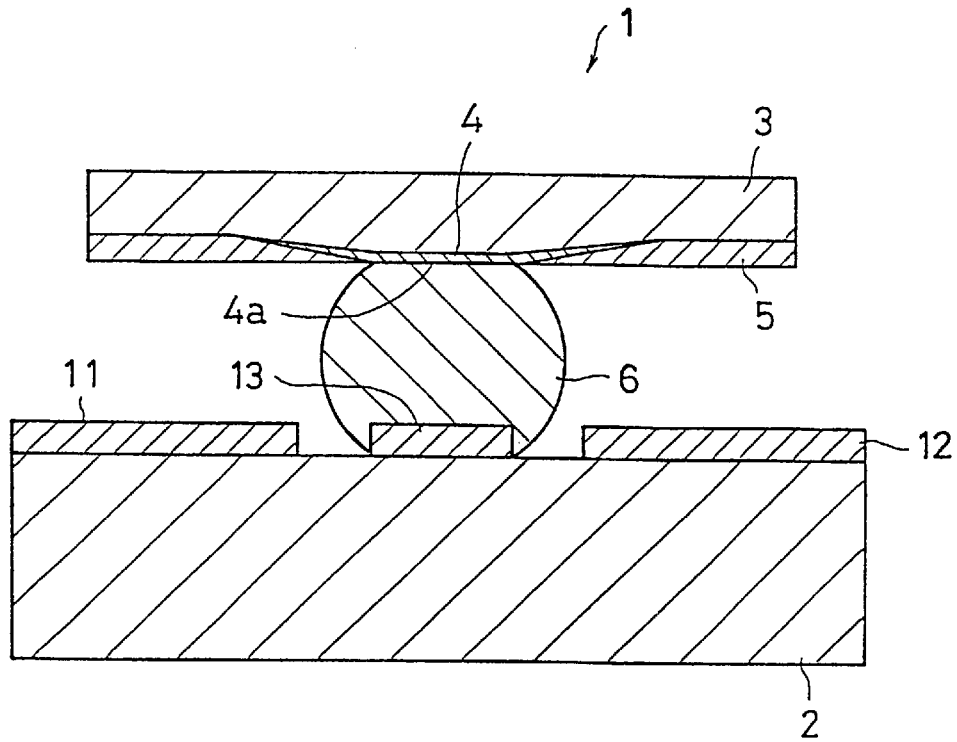
FIG. 1 is a partial cross section illustrating a state in which the semiconductor device in a first embodiment of the present invention is mounted at an external substrate.

FIG. 1 is a partial enlargement of the cross sectional structure of a semiconductor device 1 in the first embodiment of the present invention when it is mounted at an external substrate 2 such as a wiring board, and in order to facilitate the explanation, the illustration of a molded semiconductor chip mounted on a substrate 3 in the semiconductor device 1 is omitted. It is to be noted that an illustration of a molded semiconductor chip on the substrate is omitted in the figures showing subsequent embodiments, too.

The semiconductor device 1 has a basic structure in which a metal pattern 4 constituting a conductor pattern is formed at a rear surface of the substrate 3 and a front surface of the metal pattern 4 is covered with an insulating film 5 except for the connecting area 4a. The solder ball 6, which constitutes a solder bump, is bonded at the connecting area 4a. It is to be noted that the planar shape of the connecting area 4a is circular.

The area other than the connecting area 4a in the metal pattern 4 of the semiconductor device 1, i.e., the area covered with the insulating film 5, inclines toward the substrate 3, and furthermore, the thickness of the metal pattern 4 is gradually reduced toward the outside. In addition, the rear surface of the substrate 3 is formed to lie along the shape of the metal pattern 4. In other words, the portion that corresponds to the connecting area 4a is formed in a shape constituting a three-dimensional convex curve toward the solder ball 6.

The semiconductor device 1 in the first embodiment, which is structured as described above is mounted at the external substrate 2 in a manner identical to that employed in the prior art described earlier, by aligning the solder ball 6 at a specific electrode portion 13 formed between insulating layers 11 and 12 that are formed at a front surface of the external substrate 2 and by placing the whole assembly in a specific heated atmosphere to mount the semiconductor device through connection at the solder ball 6.

Figure 2:
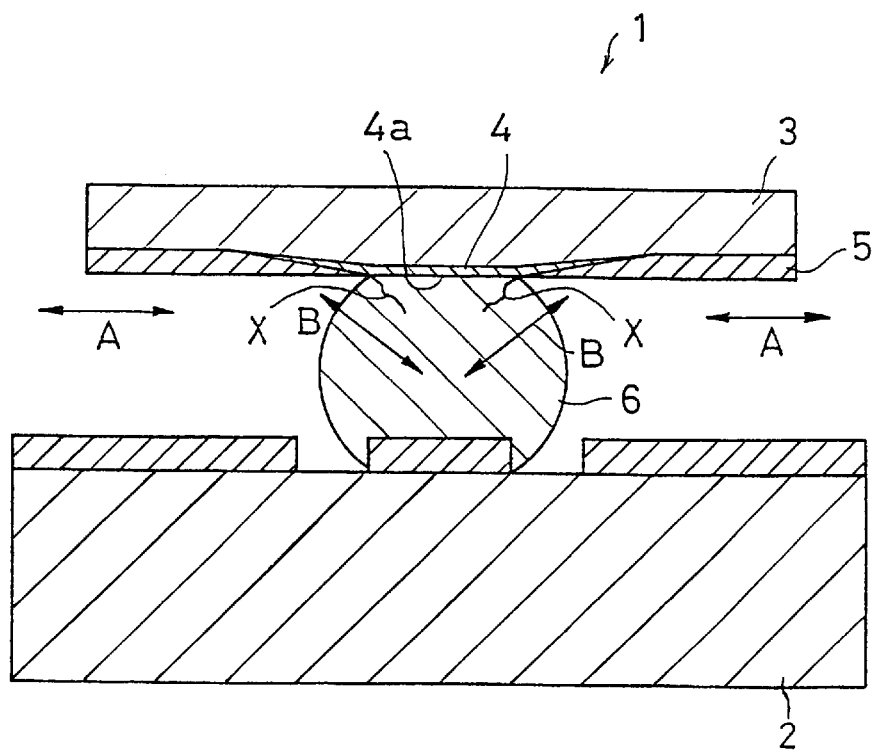
FIG. 2 is a partial cross section illustrating the direction in which stress is applied to a solder ball and cracks form as a result in the semiconductor device in the first embodiment of the present invention.

Even when the semiconductor device 1 in the first embodiment is placed in an atmosphere in which the temperature changes drastically during a reliability test conducted after it is mounted at the external substrate 2 and the difference between the coefficients of thermal expansion at the semiconductor device 1 and the external substrate 2 causes a force in the horizontal direction due to stretching, contraction and the like to be applied to the semiconductor device 1 as indicated with the reciprocal arrows A in FIG. 2, resulting in stress applied to the solder ball 6 connecting the semiconductor device 1 and the external substrate 2, the stress is applied along the inclined portion of the metal pattern 4 as indicated by the reciprocal arrows B in FIG. 2. Moreover, the stress is applied radially over the entire circumference, and therefore, is dispersed.

Consequently, cracks are less readily formed at the solder ball 6, and even if cracks X are formed, their number is reduced compared to the prior art. Furthermore, the cracks X are formed and develop in a direction that is almost the same as the direction in which the stress is applied, i.e., in a diagonal direction, unlike in the prior art. As a result, the degree of degradation in the electrical characteristics is reduced compared to the prior art, and the likelihood of disconnection is also reduced to achieve an improvement in the reliability.

Figure 3:
FIG. 3 illustrates the substrate before the metal pattern is formed during the process for manufacturing the semiconductor device in the first embodiment of the present invention.
Figure 4:
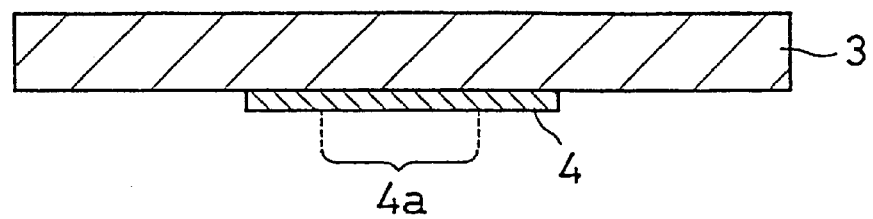
FIG. 4 illustrates a state achieved after the metal pattern is formed during the process for manufacturing the semiconductor device in the first embodiment of the present invention.

An example of the method for manufacturing the semiconductor device 1 achieving the advantages described above is explained in reference to FIGS. 3–6. First, a specific metal pattern 4 is formed at a rear surface of the ceramic substrate 3 illustrated in FIG. 3. Normally, this type of metal pattern 4 is constituted of Cu (copper) with Ni (nickel) and Au (gold) sequentially plated on the surface where a connecting area 4a is present, and this plating process may be implemented, for instance, after the formation of the metal pattern 4 as illustrated in FIG. 4.

Figure 5:
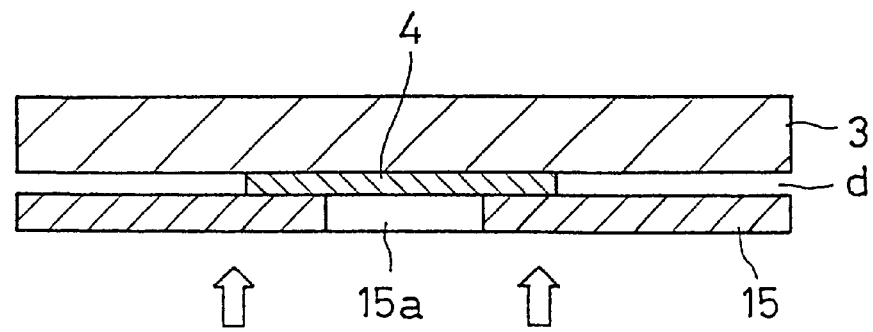
FIG. 5 illustrates a state achieved by placing a ceramic plate against the metal pattern during the process for manufacturing the semiconductor device in the first embodiment of the present invention.

Next, as illustrated in FIG. 5, a ceramic plate 15 having an empty portion 15a over the area corresponding to the connecting area 4a is placed at a specific position. Then, pressure is applied to the entire rear surface of the substrate 3 in the direction indicated by the arrows in the figure. This causes the crushed metal pattern 4 to enter a gap "d" formed by the thickness of the metal pattern 4 between the substrate 3 and the ceramic plate 15. In addition, since no force is applied to the empty portion 15a formed at the ceramic plate 15 in correspondence to the connecting area 4a, only the area other than the area at the substrate 3 corresponding to the empty portion 15a is compressed.

Figure 6:
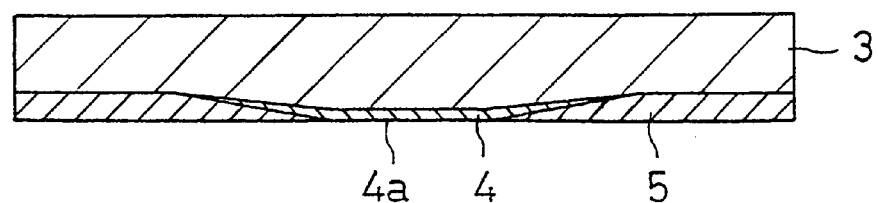
FIG. 6 illustrates a state achieved after applying pressure to the rear surface of the substrate during the process for manufacturing the semiconductor device in the first embodiment of the present invention.

Consequently, a structure in which the area other than the connecting area 4a in the metal pattern 4, i.e., the area covered with the insulating film 5 constituted of the ceramic 15 is made to incline toward the substrate 3 and the thickness of the metal pattern 4 is gradually reduced toward the outside, as illustrated in FIG. 6, is achieved. In addition, the rear surface of the substrate 3 achieves a shape that conforms to the shape of the metal pattern 4. After this, a semiconductor chip is mounted at a front surface of the substrate 3 and then is molded with resin or the like. The semiconductor device 1 illustrated in FIG. 1 is then completed by bonding a solder ball 6 to the connecting area 4a through a method in the known art. Thus, the semiconductor device 1 in the first embodiment can be manufactured with a high degree of efficiency.

Next, the semiconductor device in a second embodiment is explained. As the state achieved by mounting the semiconductor device at the external substrate 2 in FIG. 7 clearly illustrates, the members constituting the basic structure at a rear surface of a substrate 22 of the semiconductor device 21 in the second embodiment are identical to those in the semiconductor device 1 in the first embodiment, with a metal pattern 23 constituting a conductor pattern formed at a rear surface of the substrate 22 and an insulating film 24 covering a front surface of the metal pattern 23 except for a connecting area 23a. The planar shape of the connecting area 23a is circular.

A staged portion 23b is formed in the area between the connecting area 23a and the area covered with the insulating film 24 in the metal pattern 23 at the semiconductor device 21, and the staged portion 23b is formed in a tapered shape. In other words, the staged portion 23b extends diagonally relative to the connecting area 23a. The semiconductor device 21 in the second embodiment, which is structured as described above is mounted at the external substrate 2 in a manner identical to that employed in the first embodiment.

Figure 8:
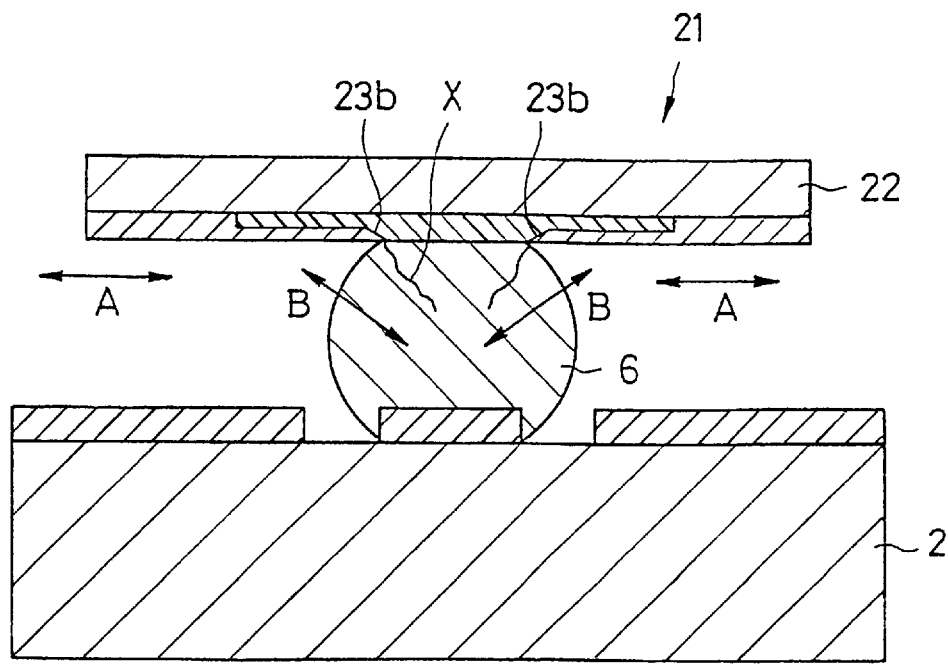
FIG. 8 is a partial cross section illustrating the direction in which stress is applied to a solder ball and cracks form as a result in the semiconductor device in the second embodiment of the present invention.

With the semiconductor device 21 in the second embodiment, too, when it is placed in an atmosphere in which the temperature changes drastically during, for instance, a reliability test conducted after it is mounted at the external substrate 2 and the difference between the coefficients of thermal expansion at the semiconductor device 21 and the external substrate 2 causes a force in the horizontal direction due to tension, contraction and the like to be applied to the semiconductor device 21 as indicated with the reciprocal arrows A in FIG. 8, resulting in stress applied to the solder ball 6 connecting the semiconductor device 21 and the external substrate 2, the stress is applied along the staged portion 23b as indicated by the reciprocal arrows B in FIG. 8. Moreover, the stress is applied virtually radially over the entire circumference, and therefore, is dispersed. Consequently, as in the semiconductor device 1 in the first embodiment, cracks are less readily formed and even if cracks X are formed, their number is reduced compared to the prior art. Thus, degradation in the electrical characteristics is reduced. Furthermore, since the cracks X are formed and develop in a diagonal direction relative to the connecting area 23a of the metal pattern 23 and not in the horizontal direction, as was the case in the prior art, the likelihood of disconnection is reduced compared to the prior art.

Figure 9:
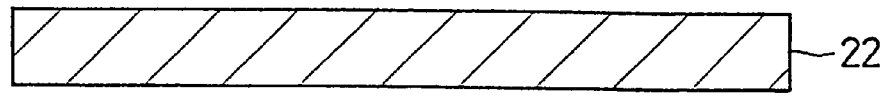
FIG. 9 illustrates the substrate before the metal pattern is formed during the process for manufacturing the semiconductor device in the second embodiment of the present invention.
Figure 10:
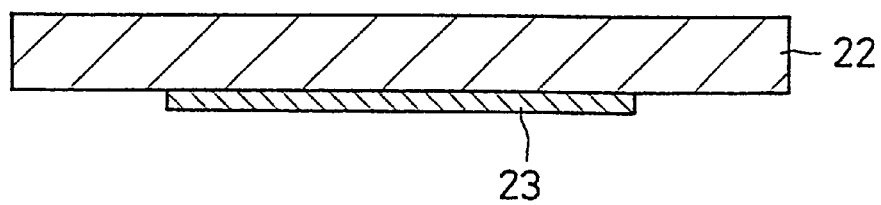
FIG. 10 illustrates a state achieved after the metal pattern is formed during the process for manufacturing the semiconductor device in the second embodiment of the present invention.
Figure 11:
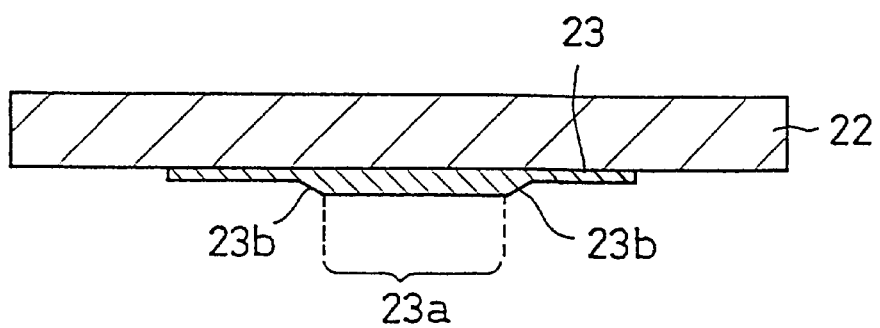
FIG. 11 illustrates a state achieved by forming a tapered staged portion at the metal pattern through etching during the process for manufacturing the semiconductor device in the second embodiment of the present invention.

An example of the method for manufacturing the semiconductor device 21 achieving the advantages described above is explained in reference to FIGS. 9–11. First, a specific metal pattern 23 is formed as illustrated in FIG. 10 at a rear surface of an insulating substrate 22 illustrated in FIG. 9. Next, by employing the etching technology in the known art, the area which is to be covered with an insulating film is ground through etching to a depth corresponding to the thickness of the insulating film except for a connecting area 23a. During this process, as illustrated in FIG. 11, etching is implemented so that the staged portion 23b achieves a tapered shape. After this, the area other than the connecting area 23a is covered with an insulating film 24 constituted of a solder resist or the like, for instance, by adopting the photolithography technology employed to manufacture this type of semiconductors device in the prior art.

Figure 12:
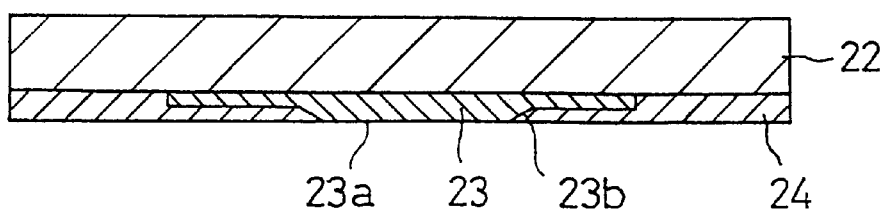
FIG. 12 illustrates a state achieved by covering the area other than the connecting area with an insulating film during the process for manufacturing the semiconductor device in the second embodiment of the present invention.

It is to be noted that normally, the entirety of the metal pattern 23 of this type is constituted of Cu (copper), with Ni (nickel) and Au (gold) sequentially plated on a surface of the connecting area 23a. This plating process may be implemented after forming the staged portion 23b through etching, as illustrated in FIG. 11, or it may be implemented after covering the area other than the connecting area 23a with the insulating film 24, as illustrated in FIG. 12.

Figure 7:
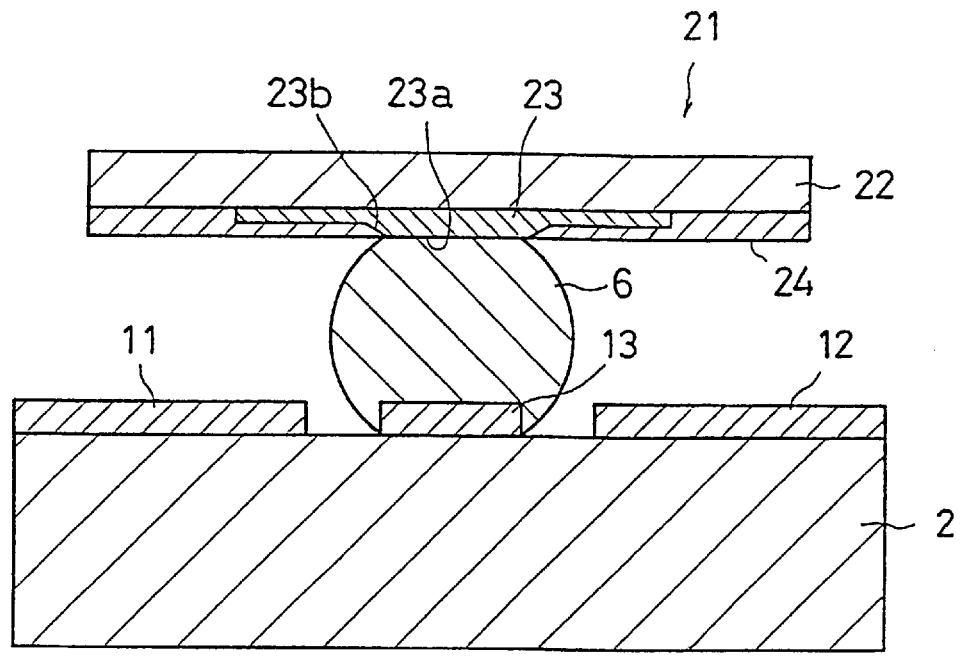
FIG. 7 is a partial cross section illustrating a state in which the semiconductor device in a second embodiment of the present invention is mounted at an external substrate.

Then, the semiconductor device 21 illustrated in FIG. 7 is completed by mounting a semiconductor chip at a front surface of the substrate 22 and molding it with resin or the like, and by bonding a solder ball 6 at a connecting area 23a through a method in the known art. Consequently, the semiconductor device 21 in the second embodiment can be manufactured in a highly efficient manner. Moreover, there is an added advantage in that the semiconductor device 21 in the second embodiment can be manufactured essentially without altering the process for manufacturing a metal pattern in the prior art.

Figure 13:
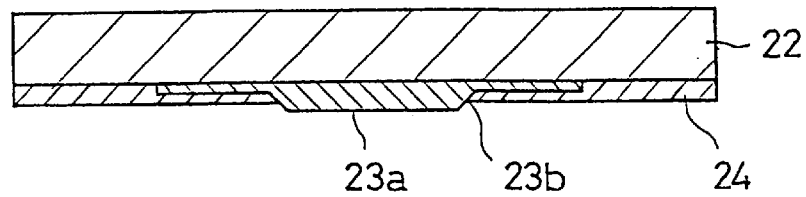
FIG. 13 illustrates a state achieved by forming an insulating film while ensuring that the connecting area projects out during the process for manufacturing the semiconductor device in a third embodiment of the present invention.
Figure 14:
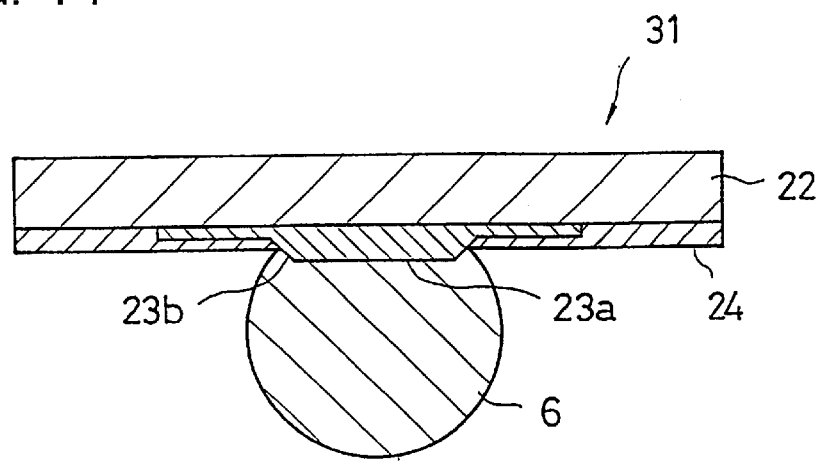
FIG. 14 illustrates a state achieved by bonding a solder ball to the projecting connecting area during the process for manufacturing the semiconductor device in the third embodiment of the present invention.

It is to be noted that in the process for manufacturing the semiconductor device 21 described above, when covering the area other than the connecting area 23a with the insulating film 24 constituted of, for instance, a solder resist, the connecting area 23a may be made to project further out relative to the insulating film 24, as illustrated in FIG. 13 by controlling the film thickness of the insulating film 24 or by forming the metal pattern 23 thicker than normal with the film thickness of the insulating film 24 unchanged and increasing the height of the staged portion 23b formed in the area between the connecting area 23a and the remaining area. In that case, when the solder ball 6 is bonded to the connecting area 23a in a subsequent step, a semiconductor device 31 in the third embodiment having a structure in which the projecting connecting portion 23a is embedded inside the solder ball 6, as illustrated in FIG. 14, is achieved.

It is to be noted that the regular metal plating treatment may be implemented on the surface of the connecting area 23a in the metal pattern 23 after forming the staged portion 23b through etching, or the treatment may be implemented after covering the area other than the connecting area 23a with the insulating film 24, as is the case with the semiconductor device 21 in the second embodiment.

Figure 15:
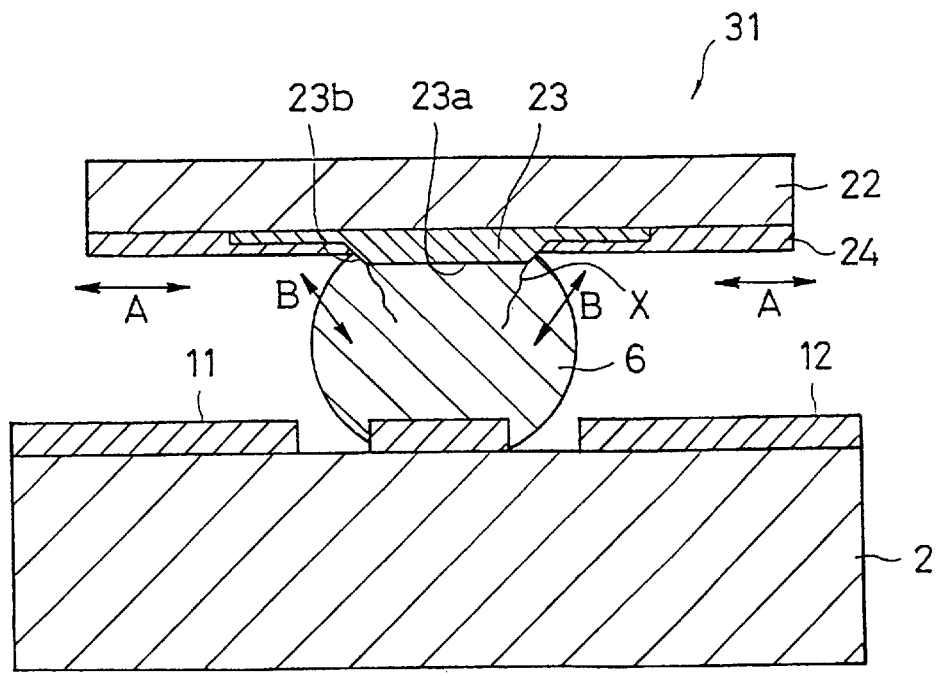
FIG. 15 is a partial cross section illustrating the direction in which stress is applied to the solder ball and cracks form as a result in the semiconductor device in the third embodiment of the present invention.

With the semiconductor device 31 in the third embodiment, too, when it is placed in an atmosphere in which the temperature changes drastically during, for instance, a reliability test conducted after it is mounted at the external substrate 2 and the difference between the coefficients of thermal expansion at the semiconductor device 31 and the external substrate 2 causes a force in the horizontal direction due to tension, contraction and the like to be applied to the semiconductor device 31 as indicated with the reciprocal arrows A in FIG. 8, resulting in stress applied to the solder ball 6 connecting the semiconductor device 31 and the external substrate 2, as illustrated in FIG. 15, the stress is applied along the staged portion 23b of the metal pattern 4 as indicated by the reciprocal arrows B in FIG. 15. Consequently, as in the semiconductor device 21 in the second embodiment, cracks are less readily formed and even if cracks X are formed, their number is reduced compared to the prior art. Furthermore, since the cracks X are formed and develop in a diagonal direction and not in the horizontal direction, as was the case in the prior art. As a result, advantages are achieved in that the degree of degradation in the electrical characteristics is reduced compared to the prior art and in that the likelihood of disconnection is also reduced. Moreover, since this embodiment adopts a structure in which the connecting area 23a projects out into the solder ball 6, good dispersion of stress is achieved to prevent cracks from forming even more effectively.

Next, the semiconductor device in a fourth embodiment is explained. As the state achieved after mounting the semiconductor device at the external substrate 2 in FIG. 16 clearly illustrates, a metal pattern 43 to constitute a conductor pattern is formed at a rear surface of a substrate 42 of the semiconductor device 41 in the fourth embodiment, with an insulating film 44 covering the surface of the metal pattern 43 except for an original connecting area 43a. A projecting portion 45 is formed through metal plating at a surface of the connecting area 43a. The projecting portion 45 is formed to project out 3 dimensionally with a convex curve toward the solder ball 6 to which it is to be bonded, and its planar shape is circular. In addition, its cross section has a shape enclosed with a circular arc and a hypotenuse having a maximum thickness of approximately 20 micro-meter. The solder ball 6 is bonded to this projecting portion 45.

Figure 17:
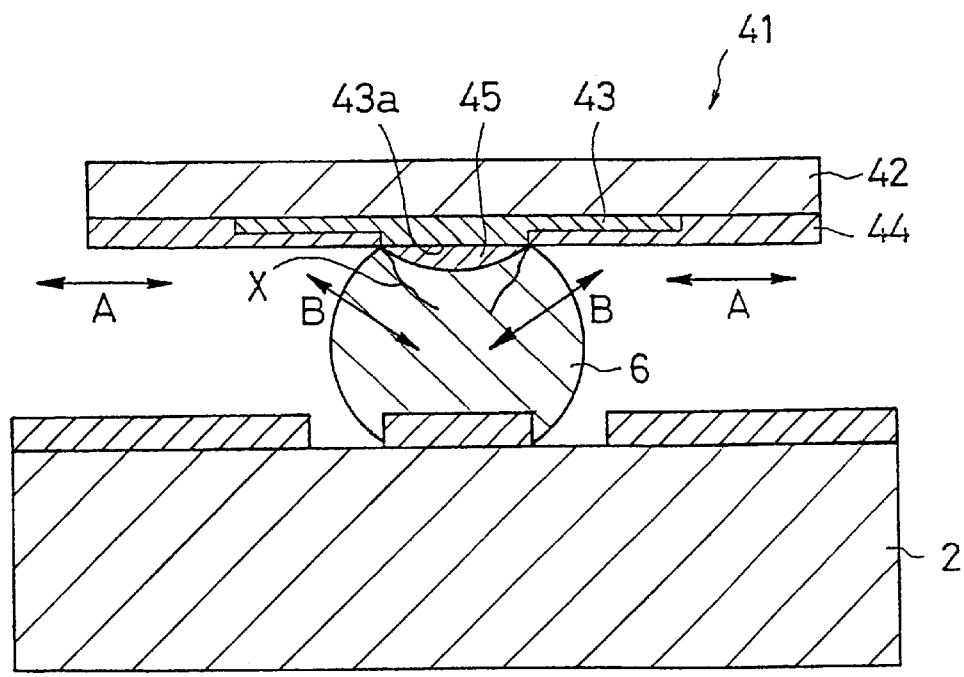
FIG. 17 is a partial cross section illustrating the direction in which stress is applied to a solder ball and cracks form as a result in the semiconductor device in the fourth embodiment of the present invention.

With the semiconductor device 41 in the fourth embodiment. too, when it is placed in an atmosphere in which the temperature changes drastically after it is mounted at the external substrate 2 and the difference between the coefficients of thermal expansion at the semiconductor device 41 and the external substrate 2 causes a force in the horizontal direction to be applied to the semiconductor device 41 as indicated with the reciprocal arrows A in FIG. 17, resulting in stress applied to the solder ball 6, the stress is applied in the direction along the shape of the circumferential edge of the projecting portion 45, as indicated with the reciprocal arrows B in FIG. 17. For instance, if the circumferential edge of the projecting portion 45 extends diagonally, the stress is applied in a direction that is almost the same as the diagonal direction, and the stress is dispersed in a radial direction over the entire circumference. Consequently, as in the semiconductor device 31 in the third embodiment, cracks are less readily formed and even if cracks X are formed, their number is reduced compared to the prior art.

Thus, the degree of degradation in the electrical characteristics is reduced in comparison to the prior art. Furthermore, since the cracks X are formed and develop diagonally and not in the horizontal direction as in the prior art, a semiconductor device with a high degree of reliability with reduced likelihood of disconnection is achieved.

It is to be noted that essentially the same advantages as those achieved by the semiconductor device 41 in the fourth embodiment by constituting the projecting portion 45 with another solder ball that is smaller than the solder ball 6 instead of constituting it through metal plating.

Figure 18:
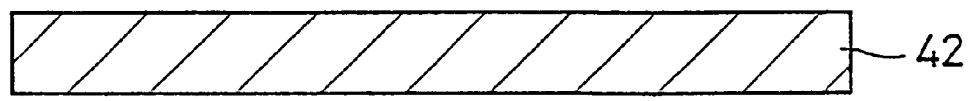
FIG. 18 illustrates the substrate before the metal pattern is formed during the process for manufacturing the semiconductor device in the fourth embodiment of the present invention.
Figure 19:
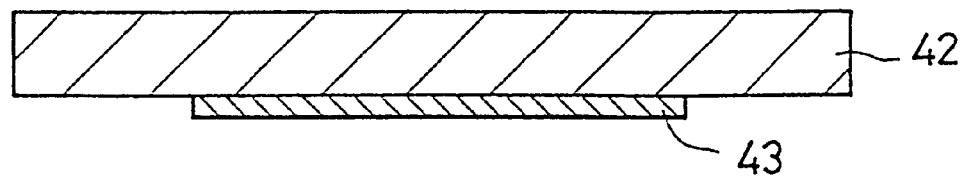
FIG. 19 illustrates a state achieved after the metal pattern is formed during the process for manufacturing the semiconductor device in the fourth embodiment of the present invention.
Figure 20:
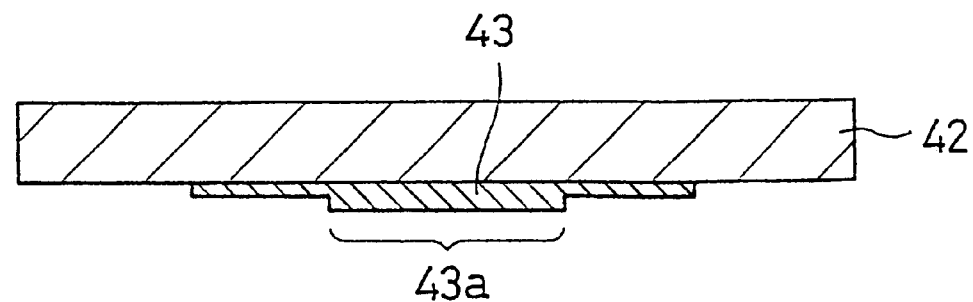
FIG. 20 illustrates a state achieved by etching the metal pattern to reduce the thickness of the area other than the connecting area relative the connecting area during the process for manufacturing the semiconductor device in the fourth embodiment of the present invention.
Figure 21:
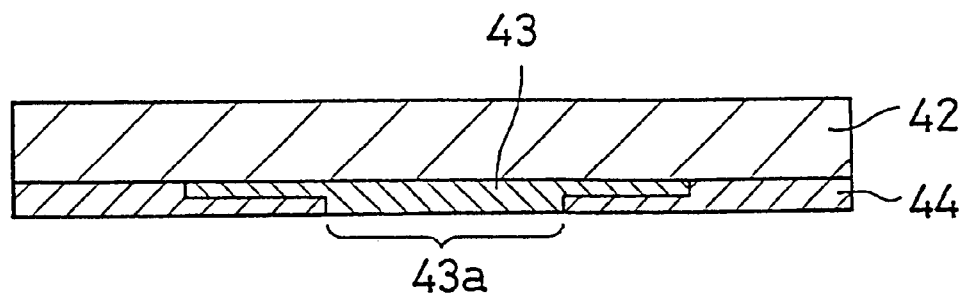
FIG. 21 illustrates a state achieved by covering the area other than the connecting area with an insulating film during the process for manufacturing the semiconductor device in the fourth embodiment of the present invention.
Figure 22:
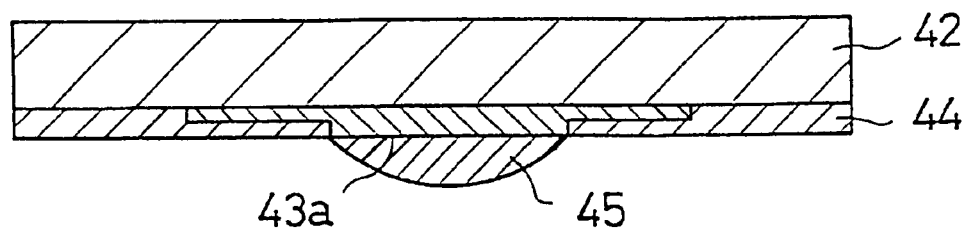
FIG. 22 illustrates a state achieved by forming a projecting portion at the connecting area through metal plating during the process for manufacturing the semiconductor device in the fourth embodiment of the present invention.

Next, the method for manufacturing the semiconductor device 41 in the fourth embodiment is explained. First, a specific metal pattern 43 is formed as illustrated in FIG. 19 at a rear surface of an insulating substrate 42 illustrated in FIG. 18. Next, by employing the etching technology in the known art, the area which is to be covered with an insulating film is ground through etching to a depth corresponding to the thickness of the insulating film except for a connecting area 43a, as illustrated in FIG. 20. As illustrated in FIG. 21, after this, the area other than the connecting area 43a is covered with an insulating film 44 constituted of a solder resist or the like, for instance, by adopting the photolithography technology employed to manufacture this type of semiconductors device in the prior art.

After this, a projecting portion 45 is formed at a surface of the connecting area 43a through metal plating. It is to be noted that the regular plating treatment to be implemented on the connecting area 43a of the metal pattern 43 may be performed by first plating the surface with, for instance, Ni (nickel) and then forming the projecting portion 45 through Au (gold) plating in the state illustrated in FIG. 20 or FIG. 21, i.e., after the etching treatment or after the formation of the insulating film 44.

Figure 16:
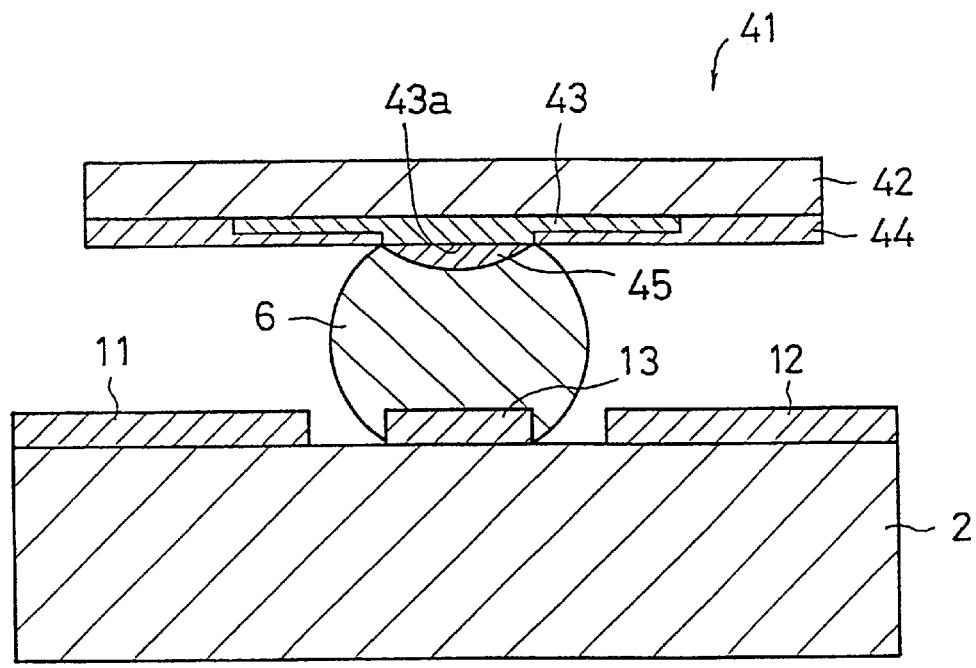
FIG. 16 is a partial cross section illustrating a state in which the semiconductor device in a fourth embodiment of the present invention is mounted at an external substrate.

Then, the semiconductor device 41 illustrated in FIG. 16 is completed by mounting a semiconductor chip at a front surface of the substrate 42 and molding it with resin or the like, and by bonding the solder ball 6 to the projecting portion 45 through a method in the known art. Consequently, the semiconductor device 41 in the fourth embodiment can be manufactured in a highly efficient manner. Furthermore, since the metal plating technology in the prior art can be directly adopted, no special technology is separately required.

Figure 23:
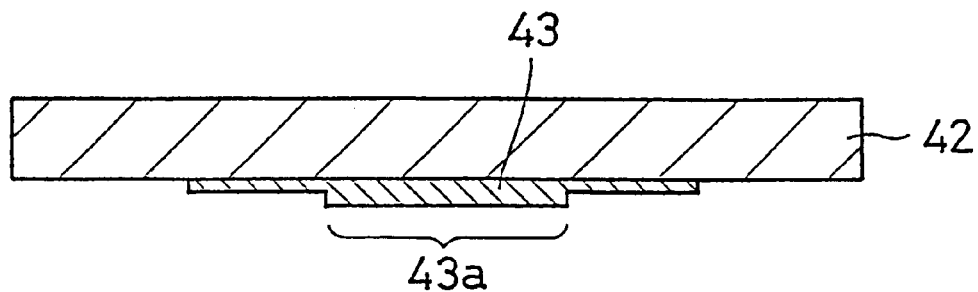
FIG. 23 illustrates a state achieved by etching the metal pattern to reduce the thickness of the area other than the connecting area relative to the connecting area during another process for manufacturing the semiconductor device in the fourth embodiment of the present invention.
Figure 24:
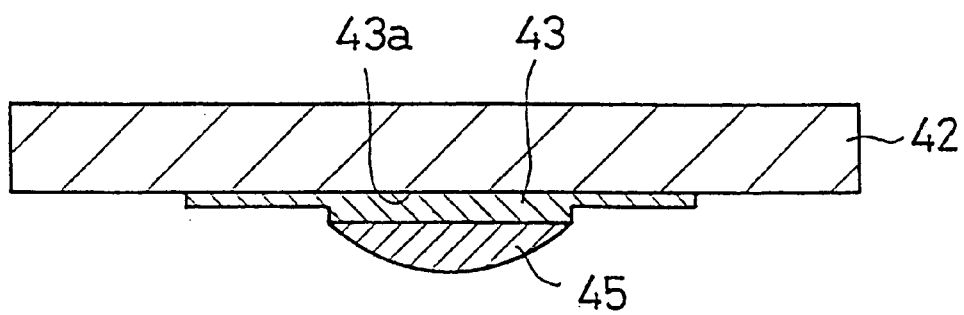
FIG. 24 illustrates a state achieved by forming a projecting portion at the connecting area through metal plating during the other process for manufacturing the semiconductor device in the fourth embodiment of the present invention.
Figure 25:
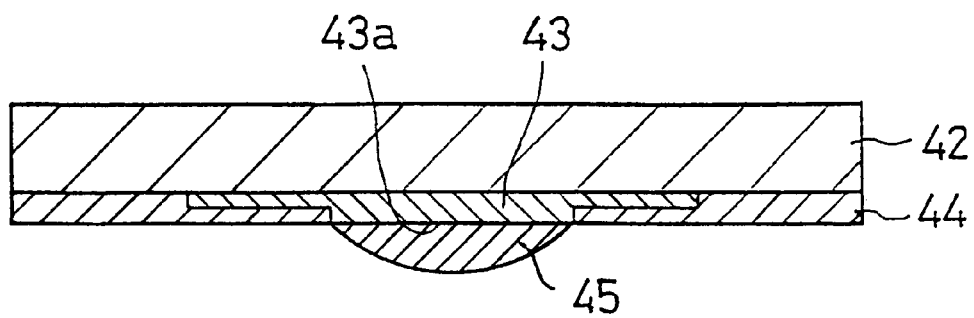
FIG. 25 illustrates a state achieved by covering the area other than the projecting portion with an insulating film during the other process for manufacturing the semiconductor device in the fourth embodiment of the present invention.

It is to be noted that during the process for manufacturing the semiconductor device 41 in the fourth embodiment, after grinding the area other than the connecting area 43a that is to be covered to a depth corresponding to the thickness over which it is to be covered through etching, as illustrated in FIG. 23, the projecting portion 45 may be formed in advance through metal plating at the surface of the connecting area 43a with the area other than the projecting portion 45 subsequently covered with the insulating film 44, as illustrated in FIG. 25.

Figure 26:
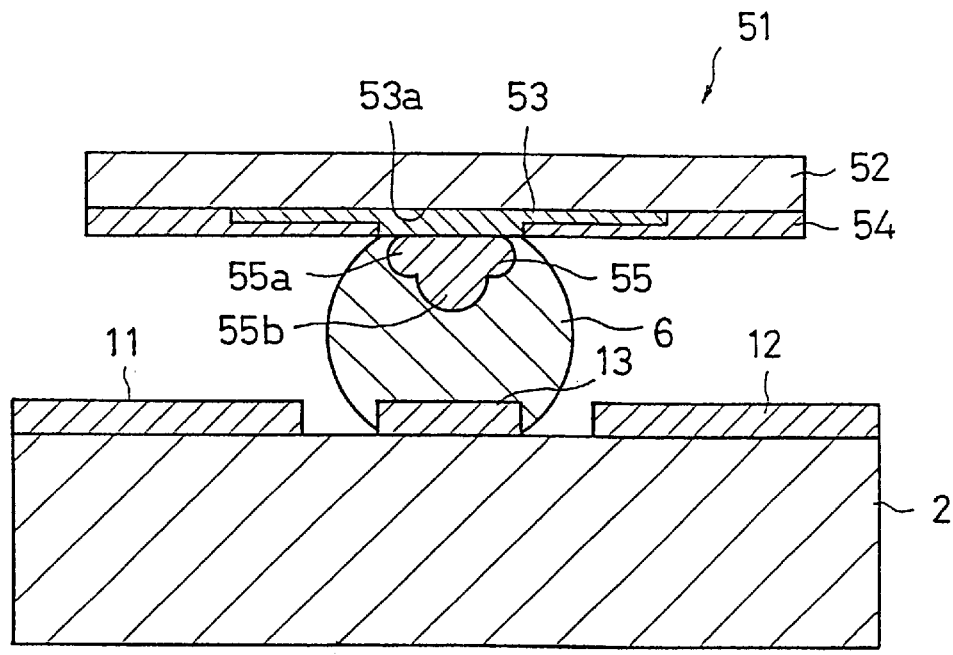
FIG. 26 is a partial cross section illustrating a state in which the semiconductor device in a fifth embodiment of the present invention is mounted at an external substrate.

Next, the semiconductor device in a fifth embodiment is explained. As the state achieved after mounting the semiconductor device at the external substrate 2 in FIG. 26 clearly illustrates, a metal pattern 53 to constitute a conductor pattern is formed at a rear surface of a substrate 52 of the semiconductor device 51 in the fifth embodiment, with an insulating film 54 covering the surface of the metal pattern 53 except for an original connecting area 53a. A projecting portion constituted of a metal bump 55 is bonded at a surface of the connecting area 53a.

The shape of the metal bump 55 is achieved by providing a semi-spherical second distended portion 55b at a first distended portion 55a whose circumferential surface constitutes a convex curve toward the outside over the entire circumference at the side where the solder ball 6 is present. It is desirable to constitute the metal bump 55 with Au (gold).

Figure 27:
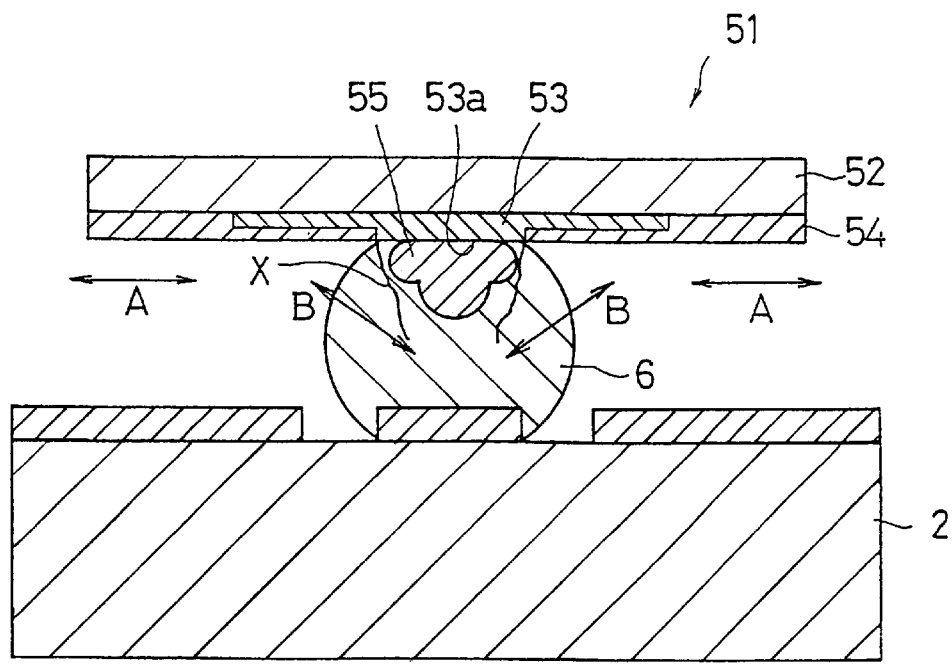
FIG. 27 is a partial cross section illustrating the direction in which stress is applied to a solder ball and cracks form as a result in the semiconductor device in the fifth embodiment of the present invention.

With the semiconductor device 51 in the fifth embodiment, too, when it is placed in an atmosphere in which the temperature changes drastically after it is mounted at the external substrate 2 and the difference between the coefficients of thermal expansion at the semiconductor device 51 and the external substrate 2 causes a force in the horizontal direction to be applied to the semiconductor device 51 as indicated with the reciprocal arrows A in FIG. 27, resulting in stress applied to the solder ball 6, the stress is applied in a direction that is almost along the line connecting the first distended portion 55a of the metal bump 55 and the external circumference of the second distended portion 55b, as illustrated with the reciprocal arrows B in FIG. 27. In addition, the stress to the solder ball 6 is dispersed in a radial direction over the entire circumference of the metal bump 55. As a result, as is the case with semiconductor devices in the previous embodiments explained so far, cracks are less likely to form and thus, the degree of degradation in the electrical characteristics can be reduced. In addition, even if cracks X are formed, their number is reduced compared to the prior art. The cracks X are formed and develop in the direction that almost matches the direction of a tangential line of the external circumference of the first distended portion 55a of the metal bump 55 and not in the horizontal direction as was the case in the prior art, thereby achieving an advantage that the likelihood of disconnection is reduced as well.

Figure 28:
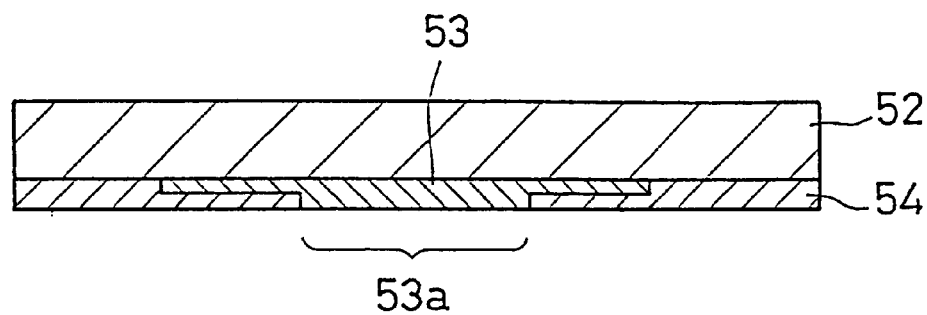
FIG. 28 illustrates a state achieved by covering the area other than the connecting area with an insulating film during the process for manufacturing the semiconductor device in the fifth embodiment of the present invention.
Figure 29:
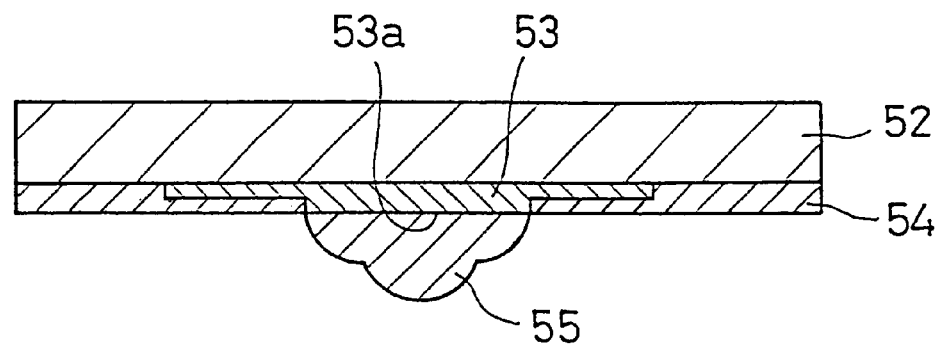
FIG. 29 illustrates a state achieved by bonding a metal bump to the connecting area during the process for manufacturing the semiconductor device in the fifth embodiment of the present invention.

Next, the method for manufacturing the semiconductor device 51 in the fifth embodiment is explained. First, as illustrated in FIG. 28, the specific metal pattern 53 is formed at a rear surface of the insulating substrate 52 through, for instance, a method in the prior art and the area other than the connecting area 53a is covered with the insulating film 54. Then, it is only necessary to bond the metal bump 55 to the connecting area 53a, as illustrated in FIG. 29. In other words, only one step needs to be added to the process in the prior art. Consequently, the production is greatly facilitated. It is to be noted that the metal bump 55 may be bonded to the connecting area 53a in advance before covering the metal pattern with the insulating film 54, with the area other than the metal bump 55 subsequently covered with the insulating film 54. The technology for mounting metal bumps in the known art employed in the normal wire bond method may be adopted when bonding the metal bump 55.

Figure 30:
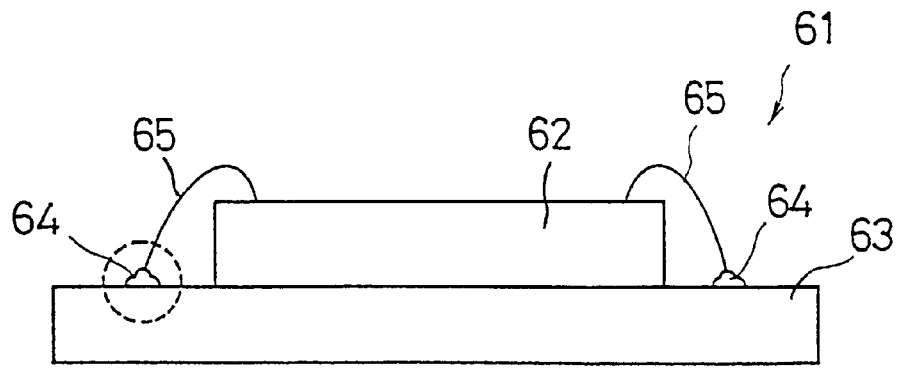
FIG. 30 illustrates a schematic structure of another semiconductor device having metal bumps which may be used as the metal bumps in the semiconductor device in the fifth embodiment of the present invention.
Figure 31:
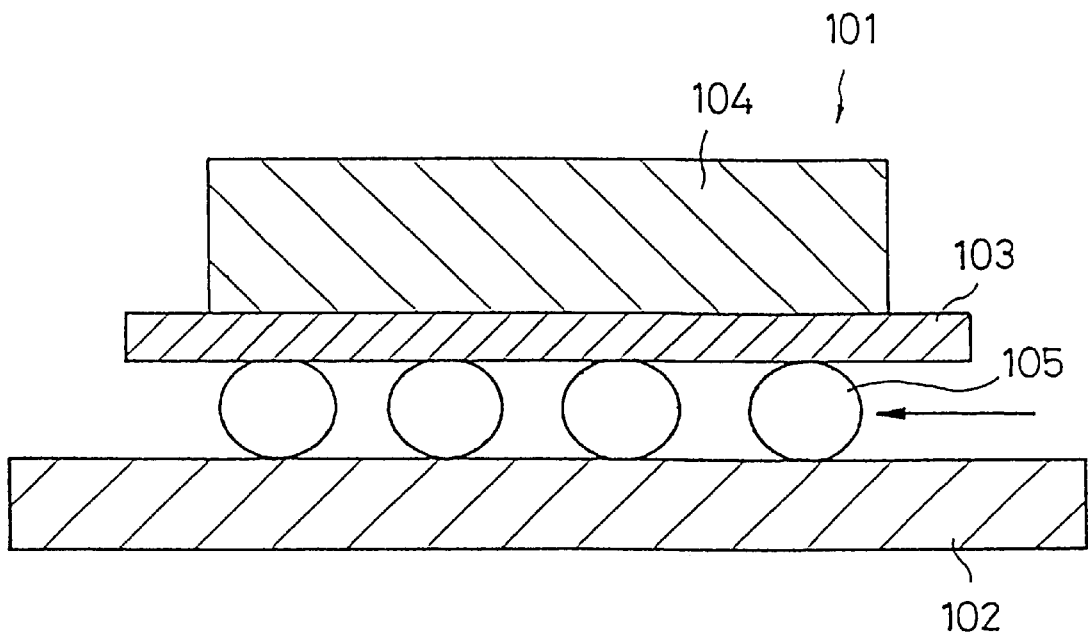
FIG. 31 is a side view illustrating a state achieved by mounting a semiconductor device in the prior art at an external substrate.
Figure 32:
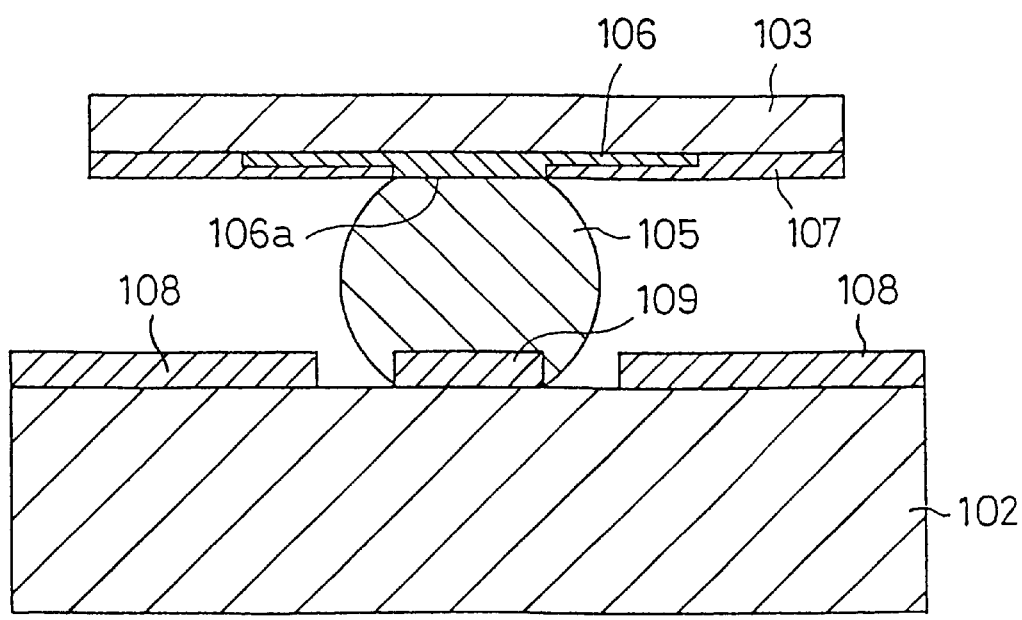
FIG. 32 is a partial cross section illustrating a state in which a semiconductor device in the prior art is mounted at an external substrate.
Figure 33:
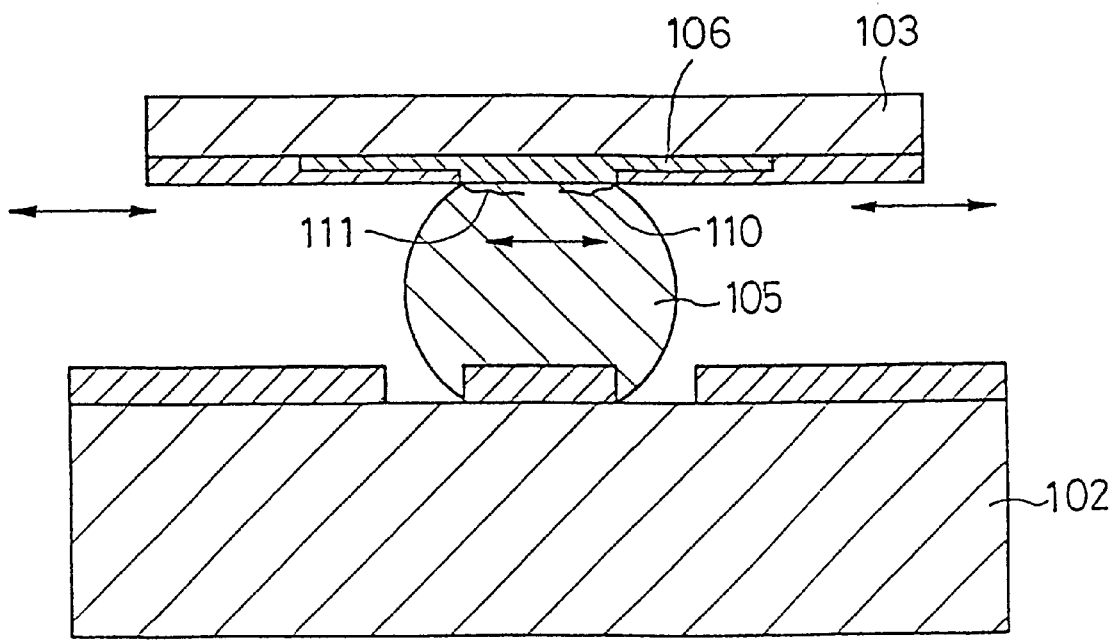
FIG. 33 is a partial cross section illustrating the direction in which stress is applied to a solder ball and cracks form as a result in a semiconductor device in the prior art.

The metal bump used in a semiconductor device 61 in the known art illustrated in FIG. 30, for instance, may be directly utilized as the metal bump 55, without having to manufacture a special metal bump. The semiconductor device 61 features a structure achieved by connecting an electrode pad at a semiconductor chip 62 and an inner lead at a substrate 63 through a thin metal wire 65 using a metal bump 64. Thus, the metal bump 64 used in this type of semiconductor device 61 may be directly employed as the metal bump 55.

Furthermore, while a structure achieved by forming in advance a metal bump 64 and a thin metal wire 65 as an integrated unit has been proposed in recent years, the thin metal wire 65 may be cut off from the metal bump 64 in such a case to be used as a metal bump 55 to be bonded to the solder ball 6 in the semiconductor device 51 in the fifth embodiment.

As explained above, even when the semiconductor device according to the present invention is placed in an atmosphere with its temperature changing drastically during, for instance, a reliability test conducted after it is mounted at a wiring board, cracks are less readily formed at the solder bumps, and even if they are formed, they are prevented from causing disconnection. As a result, a semiconductor device with a high degree of reliability, with no degradation in the electrical characteristics, can be provided. Furthermore, through the method for manufacturing a semiconductor device according to the present invention, such a semiconductor device can be manufactured with ease and with a high degree of efficiency.

While the invention has been particularly shown and described with respect to preferred embodiments of the semiconductor device and the manufacturing method thereof according to the present invention by referring to the attached drawings, the present invention is not limited to these examples and it will be understood by those skilled in the art that various changes in form and detail may be made therein without departing from the spirit, scope and teaching of the invention.

The entire disclosure of Japanese Patent Application No.9-367155 filed on Dec. 25, 1997 including specification, claims, drawings and summary is incorporated herein by reference on its entirety.

What is claimed is:

1. A semiconductor device comprising:

a substrate having front and rear surfaces;

a semiconductor chip placed on the front surface of said substrate; and a conductive pattern formed on the rear surface of said substrate, said conductive pattern having a connecting area to be bonded with a solder bump, a first area outside said connecting area, and a portion of the first area being covered with an insulating film, a thickness of said insulating film and the first area continuously decreasing from the rear surface of said substrate to a contact surface of said connecting area.

2. A semiconductor device according to claim 1, wherein a thickness of said conductive pattern in the first area gradually decreases with increasing distance from the connecting area.

3. A semiconductor device according to claim 2, wherein a portion of said rear surface of said substrate that corresponds to the connecting area distends toward the solder bump, with the first region formed in a shape conforming to the shape of the distension.

4. A semiconductor device according to claim 1, wherein:

said solder bump is formed in a roughly spherical shape.

5. A semiconductor device according to claim 1, wherein:

said semiconductor chip is at least partially molded.

6. A semiconductor device comprising:

a substrate having front and rear surfaces;

a semiconductor chip placed on the front surface of said substrate; and a conductive pattern formed on the rear surface of said substrate, said conductive pattern having a connecting area to be bonded with a solder bump, a first area outside the connecting area, and a staged portion between the connecting area and the first area, the first area and a portion of the staged portion being covered with an insulating film, a thickness of said insulating film continuously decreasing from a start of the staged portion to a contact surface of said connecting area.

7. A semiconductor device according to claim 6, wherein: said solder bump is formed in a roughly spherical shape.

8. A semiconductor device according to claim 6, wherein: said semiconductor chip is at least partially molded.

9. A semiconductor device according to claim 6, wherein said connecting area has a projecting portion projecting further out toward said solder bump relative to said insulating film, said projecting portion to extend into the solder bump.

* * * * *